Jan. 23, 1962 F. F. OFFNER 3,018,444

TRANSISTOR AMPLIFIER

Filed April 29, 1954 2 Sheets-Sheet 1

INVENTOR

Franklin F. Offner

BY Pierce, Scheffler & Parker

ATTORNEYS

TRANSISTOR AMPLIFIER

Filed April 29, 1954 2 Sheets-Sheet 2

INVENTOR

Franklin F. Offner

BY Pierce, Scheffler & Parker

ATTORNEYS

United States Patent Office
3,018,444
Patented Jan. 23, 1962

3,018,444

TRANSISTOR AMPLIFIER

Franklin F. Offner, % Offner Electronics Inc., 5320 N. Kedzie Ave., Chicago 25, Ill.

Filed Apr. 29, 1954, Ser. No. 426,325
5 Claims. (Cl. 330—10)

This invention relates to electronic amplifiers and in particular to amplifiers employing transistors instead of the more conventionally used vacuum tubes as the amplifying element in the various stages.

One object of the invention is to provide an amplifier of the transistor type featuring the use of synchronously operated switching means at the input and output sides respectively of the amplifier which makes it possible to amplify low frequency input signals with a minimum of noise. Heretofore application of the transistor amplifier has been limited to alternating current signal voltages of at least several hundred cycles because the noise factor increases to a very large value at low frequencies.

Another object is to provide an amplifier of the transistor type featuring P-N-P and N-P-N transistor stages arranged in alternation, each stage including a coupling resistor therein to prevent amplification of static currents.

Another object of the invention is to provide an amplifier of the transistor type having a high input impedance characteristic developed by means of an alternating current feedback circuit.

Still another object is to provide a transistor type amplifier having a feedback circuit effective to stabilize the operating point of the amplifier, i.e. to prevent any change therein with a variation in ambient temperature.

A further object is to provide a transistor type amplifier having a feedback circuit which stabilizes the amplification and preserves the wave form.

Another object is to provide an amplifier of the transistor type which reduces the output impedance of the amplifier making the performance less dependent upon the load.

Yet another object is to provide a transistor type amplifier which reduces the direct current amplification to a low value, while maintaining the alternating current amplification, thus making the amplification essentially alternating current, which is desired since the signal to be amplified is alternating current.

The foregoing as well as other objects of the invention will become more apparent from the following detailed description of preferred embodiments of the invention and the accompanying drawings.

FIG. 1 of the drawings is a schematic circuit diagram of one type of a transistor amplifier embodying the principles of the invention;

Figures 1, 2, 3, 4:
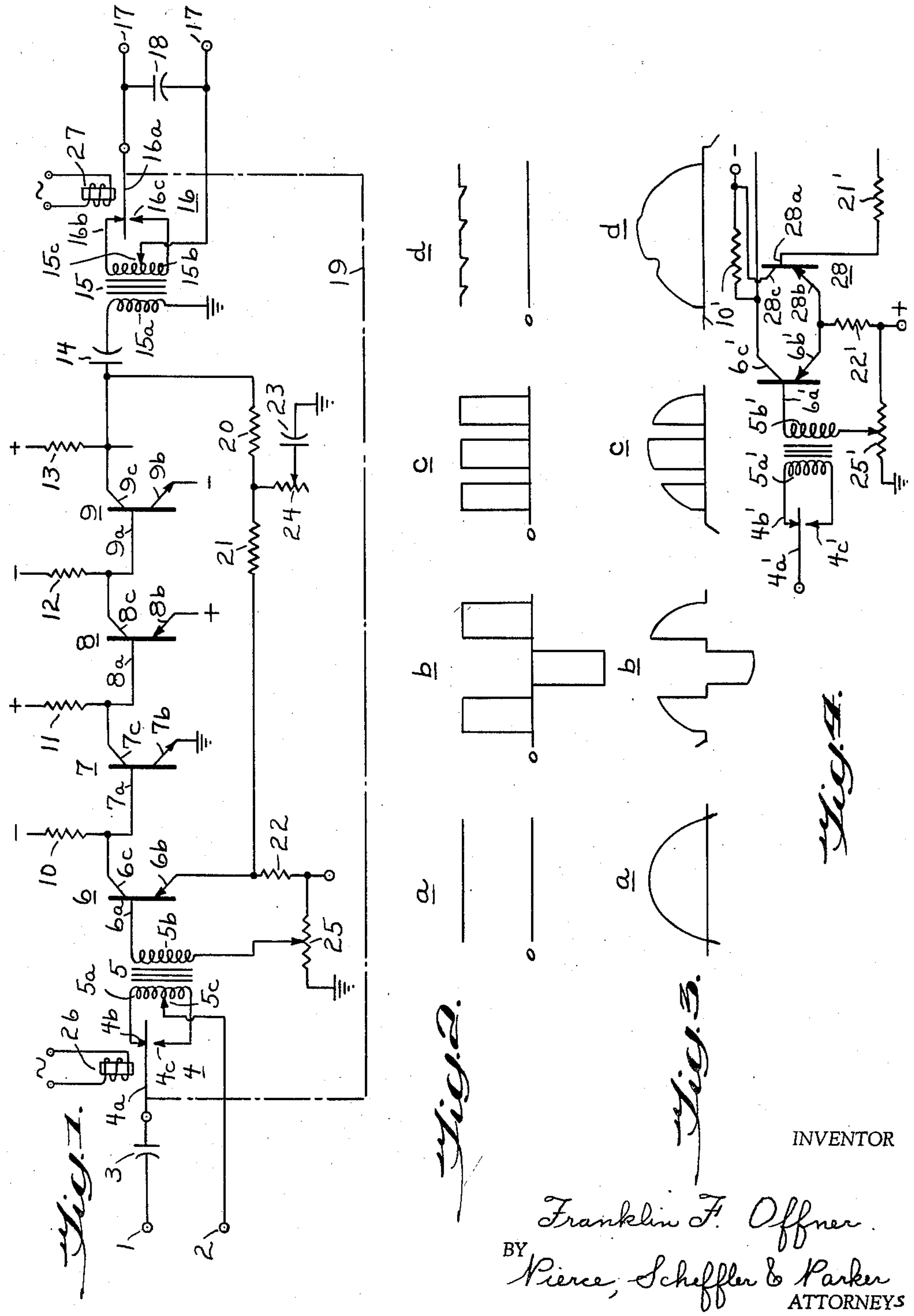
FIG. 2 shows typical wave forms in the amplifier with a direct current input.
FIG. 3 illustrates typical wave forms in the amplifier with an alternating current input.
FIG. 4 is a fragmentary circuit diagram illustrating a modification for the feedback circuit shown in the circuit of FIG. 1.

With reference now to FIG. 1, the low-frequency signal to be amplified is applied to input terminals 1, 2. The input circuit from terminal 1 includes a condenser 3 which functions to remove any direct current component from the input signal, and the vibrator blade *4a* of a commutating switch 4 which operates between and alternately engages fixed contacts *4b*, *4c*. The latter are connected to the terminal ends of the primary winding *5a* of transformer 5. The input circuit from terminal 2 leads to a mid tap *5c* on the transformer primary *5a*. Thus as blade *4a* alternately engages fixed contacts *4b*, *4c*, the input is applied in alternation to the two halves of the transformer primary *5a*.

One side of secondary *5b* is connected to the input base *6a* of a P-N-P junction-type transistor 6. The emitter electrode is designated *6b* and the collector electrode *6c*. Succeeding amplifier stages consist of alternate N-P-N and P-N-P transistors 7, 8 and 9, the N-P-N transistors being 7 and 9 and the P-N-P transistors being 6 and 8. The collector *6c* of transistor 6 includes a load resistor 10 to supply operating negative potential from a suitable source. In a similar manner, collector *8c* of the other P-N-P transistor includes a load resistor 12 to supply operating negative potential, and collectors *7c* and *9c* of the N-P-N transistors 7 and 9 include load resistors 11 and 13 respectively to supply operating positive potential from a suitable source. To give the proper operating potential on transistors 8 and 9, their emitters *8b* and *9b* are returned to positive and negative potentials, respectively.

The output of transistor 9 is fed through condenser 14 to the primary *15a* of output transformer 15. Another commutating switch 16 including a vibrator blade *16a* operating between and alternatingly engaging fixed contacts *16b*, *16c* connected to the ends of transformer secondary *15b* serves to reconvert the output substantially to a facsimile of the input, but amplified. The blade *16a* is connected over a lead to one of the two output terminals 17 and from a center tap *15c* on transformer secondary *15b* another lead extends to the other of the output terminals. A condenser 18 connected in parallel with the output terminals 17 serves to remove any switching transients that may be present in the output. The blade *16a* is arranged to operate in synchronism with the blade *4a* as indicated schematically by the dashed line 19.

Feedback is provided from a tap at the input side of condenser 14 through series connected resistors 20 and 21, to the emitter of transistor 6 by means of resistor 22. A portion of the alternating current signal is removed from the feedback by condenser 23 and variable resistor 24 connected in series, the resistor 24 being connected into the circuit between resistors 20, 21, and the condenser 23 being connected to ground. The operating point of the amplifier is set at the desired level by adjustment of the base potential by variable resistor 25 to which the other side of the transformer secondary *5b* is connected.

The use of alternating P-N-P and N-P-N transistors retains the output potential of each stage at approximately the same potential level (but alternating positive and negative), so that a high potential supply is not needed; and also allows direct current feedback to be readily employed.

The feedback has several purposes: first, it stabilizes the operating point of the amplifier to prevent change with ambient temperature variations; second, it is used to reduce the direct current amplification to a low value, while maintaining alternating current amplification, thus making the amplification essentially alternating current, which is desired since the signal to be amplified is alternating current; third, it stabilizes the amplification and preserves the signal wave-form; fourth, it reduces the output impedance of the amplifier, making the performance less dependent on the load; and fifth, it raises the input impedance of the amplifier.

These objectives are achieved by using a combination of alternating current and direct current feedback.

The direct current feedback ratio is established by the ratio of resistor 22 to resistors 20 plus 21. This ratio is made high enough that the gain of the amplifier is reduced to a low value. At the same time, resistor 25 is set at a point which corresponds to the desired operating point of transistor 9. Then, any variation in this operating point will produce a change in the current through 22, in such a direction as to return the operation to the desired point.

In order to prevent simultaneous equal reduction of the alternating current amplification, condenser 23 is used to by-pass the signal-frequency component of the feedback. If resistor 24 were omitted, essentially all signal frequency feedback would be eliminated. However, the desirable objectives of alternating current feedback would then be lost. Therefore, resistor 24 is made to have a minimum value corresponding to the maximum alternating current feedback which will give the desired performance. Then, increasing 24 will increase the alternating current amplification. Resistor 24 thus serves as the amplifier gain control.

The size of condenser 23 is proportioned to give undistorted amplification at the frequency of commutating switch 4, but to give low amplification below this frequency. This is desirable since the noise per cycle bandwidth generated by the transistors is inversely proportional to frequency.

In many applications, particularly biological, such as in electroencephalography, it is desired to maintain a high input impedance to an amplifier. In this way, the effective amplification will not be appreciably affected by variations in the resistance of the electrode connections to the subject. The transistors have, however, a low input impedance, usually of the order of 1,000 ohms for base-input connection. The effective amplifier input impedance is multiplied approximately in the ratio of the alternating current feedback employed. Thus, it is readily possible to increase the input impedance to over 100,000 ohms by alternating current feedback as shown.

The commutating switches 4 and 16 may, for example, be driven by magnetic coils 26 and 27, respectively. The coils may be excited by alternating current of the desired commutating frequency. The operation of the switches is then as follows. Assume first that condenser 3 is not in the circuit, and a direct current is applied directly to the input. As the switch blade 4*a* then first makes engagement with the upper contact 4*b*, then with the lower contact 4*c*, the signal current flows through the transformer primary 5*a* first in one way, and then in the reverse. A rectangular wave alternating current is thus generated. This is illustrated in FIGURE 2. At *a* is shown the applied direct current signal. At *b* is shown the rectangular wave generated by the switching action. The short length of zero signal between the waves is due to the switching time, when the switch blade 4*a* is between the two contacts 4*b*, 4*c*.

After amplification, a similar switching action takes place at commutating switch 16, re-forming the direct current, at *c* but with the momentary interruptions due to the switching time. These are essentially eliminated by condenser 18, as shown at *d*.

In amplifying alternating current signals, the action is similar to that described. The action on a low frequency alternating current is illustrated in FIGURE 3, which shows how a low frequency alternating current signal at *a* is converted to a rectangular wave of the chopper or commutator frequency at *b*, but with a modulation of amplitude, so that the essential form of the signal is retained in each rectangular wave after switching. The output switching then reforms the original wave, as shown at *c* and *d*, the figures corresponding to those in FIGURE 2.

To carry the waves of the frequency produced by switching, the amplifier need only carry the switching frequency, plus side-bands. Thus, if an amplifier for electroencephalography is to carry from ½ to 30 cycles per second, and the switching frequency is 400 per second, the amplifier must carry the band from 370 to 430 c.p.s. Consider the amplifier noise carried in this band. It has been shown that since the noise voltage per cycle is inversely proportional to frequency, the total noise N is proportional to a constant $k$ times the ratio of the top frequency $f_2$ carried to the lower frequency $f_1$, i.e., $$N=kf_2/f_1$$

The noise voltage in the modulated band of 370 to 430 cycles per second is $$N=k\frac{430}{370}=1.17k$$

If it were attempted to amplify the signal directly, the noise would have been $$N=k\frac{30}{0.5}=60k$$

or more than 50 times the noise. At the low signal levels encountered, the noise would have been prohibitive.

The importance of this aspect of the invention in making possible a sensitive low-frequency transistor amplifier is thus apparent. In contrast with vacuum tubes, in which the shot noise per unit band-width is substantially independent of frequency; and in which the flicker noise shows only a moderate increase at low frequencies, the noise in transistors increases in the manner described, according to physical laws of semi-conductors. Thus, it is impossible to obtain high sensitivity at low frequencies, except by the transposition to a higher frequency, as provided in this invention.

FIG. 4 illustrates a circuit for obtaining an amplified feedback in the FIG. 1 circuit. The arrangement of the input circuit is similar to that of FIG. 1 and hence corresponding components have been given the same reference numerals but with primes added thereto to distinguish them from FIG. 1. The feedback connection from resistor 21′ instead of being connected directly to the emitter 6*b*, as in the FIG. 1 circuit, is however connected to the input base 28*a* of another P-N-P transistor 28. The emitter 28*b* is connected to the emitter 6*b′* and the collector 28*c* is connected to the source of negative potential that feeds resistor 10′. The transistor 28 increases the degenerative voltage current through resistor 22′. It accomplishes this through its current amplifying property, and thus provides additional stabilization.

Figure 5:
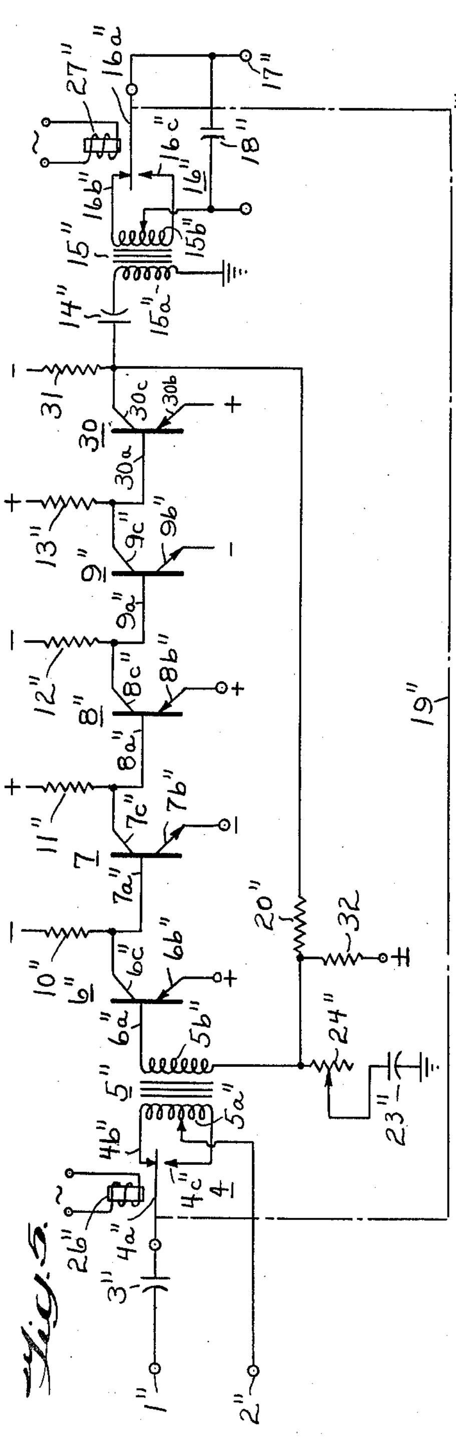
FIG. 5 is a view similar to FIG. 1 showing a somewhat different type amplifier circuit incorporating the invention.

FIG. 5 illustrates a modified amplifier circuit wherein the feedback is applied to the base input circuit 6*a″* of the input transistor 6″ rather than into the emitter. This is sometimes advantageous, as the impedance is higher, allowing greater feedback to be conveniently obtained. Components in the FIG. 5 circuit having the same function as those in FIG. 1 have been assigned the same reference numerals but with double primes added for purposes of distinction. To obtain the correct feedback phase, an odd number of amplifier stages must now be employed. Consequently an additional stage consisting of P-N-P transistor 30 and resistor 31 is therefore added. A resistor 32 is also added, one end of this resistor being connected to a point in the feedback circuit between resistors 20″ and 24″, and the other end of the resistor 32 being connected to a positive or negative potential source as required. Resistor 32 is added to give the correct potential at the base terminal 6*a″* of transistor 6″ for proper amplifier operation. The potential applied to each transistor emitter and collector is so selected as to give the desired operating point. With a proper choice of potentials, it may be possible to obtain the desired operating point without use of the additional resistor 32.

Figures 6, 7:
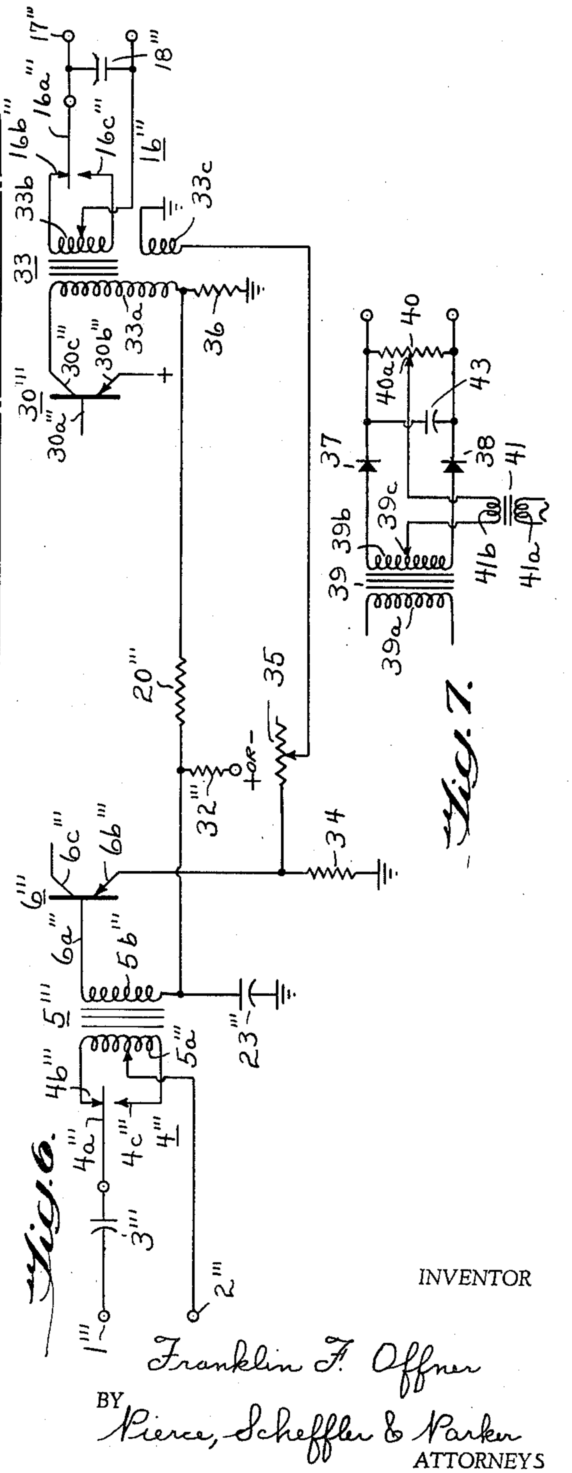
FIG. 6 shows a circuit similar to FIG. 5 but employing a different feedback arrangement.
FIG. 7 is a circuit diagram showing a different arrangement for the commutating switching means at the output side of the amplifier.

FIG. 6 illustrates an embodiment of the invention somewhat similar to the circuit of FIG. 5 but having a different feedback arrangement. Those components in the FIG.

6 circuit having the same function as in the FIG. 5 circuit have been given the same reference numerals but with triple primes added for purposes of distinction. The output transformer 15 of the FIG. 5 circuit is replaced by a transformer 33. The latter includes a primary winding 33*a* a secondary winding 33*b* connected to the stationary contacts of the commutating switch 16‴ and a tertiary winding 33*c* for developing the alternating current feedback, the potential induced in winding 33*c* being applied to resistor 34 in the emitter circuit of transistor 6‴ through variable resistor 35, which serves as a gain control. If a variable gain is not desired, the emitter of transistor 6‴ could be returned directly to tertiary winding 33*c*, the design of the latter then being chosen to give the desired feedback.

The direct current feedback in the FIG. 6 circuit is obtained from resistor 36 connected in series with transformer primary winding 33*a*, the connection from resistor 36 being carried through to the secondary of input transformer 5‴. Resistor 24″ of the FIG. 5 circuit is omitted, so that essentially no alternating current feedback is produced by this section of the feedback circuit.

In lieu of the electro-mechanical demodulation provided by the vibrating switch 16 as in the circuit of FIG. 1, an electronic or electric demodulator may be used, as for example, the balanced demodulator illustrated in FIG. 7. With reference now to that view it will be seen that rectifiers 37, 38 are connected in the output leads from the ends of secondary winding 39*b* of the output transformer 39 which has the function of output transformer 15 in FIG. 1. A resistor 40 from which the output is taken is connected across the output leads at the output side of the rectifiers 37, 38, and the secondary winding 41*b* of a switching transformer 41 is connected between a center tap 39*c* on the output transformer secondary 39*b* and a center tap 40*a* on resistor 40. A condenser 43 connected in parallel with resistor 40 serves the same function as condenser 18 in the FIG. 1 circuit in smoothing out switching transients.

The primary 41*a* of the switching transformer 40 is energized from the same source of alternating current as is used to energize the magnetic coil 26 which effects vibration of the contact blade 4*a* of commutating switch 4 at the input. Consequently the rectifiers 37, 38 conduct in alternation and in synchronism with the operation of contact blade 4*a*. Other types of balanced demodulators, well known per se in the art may of course be substituted for the one which is illustrated in FIG. 7.

In conclusion, while certain embodiments of my invention have been described and illustrated, it is to be understood that such embodiments are typical rather than limitative and hence various minor changes in the circuits may be made without however departing from the spirit and scope of the invention as defined in the appended claims.

I claim:

1. A multiple-stage amplifier circuit having an odd-numbered plurality of stages; a transistor in each of said stages, each of said transistors having at least base, emitter, and collector electrodes, the successive stages being provided alternately with P-N-P and N-P-N type transistors; means for operatively biasing said transistors; each of said transistors having an input circuit between said base and emitter electrodes, and an output circuit between said collector and emitter electrodes, the collector electrode of each of said transistors being direct current coupled directly to the base electrode of a succeeding transistor; a direct current negative feedback path connected over more than one stage from the direct current collector load in the output circuit of the last transistor stage to the base electrode of the first transistor stage; and gain control means coupled to the base electrode of said first transistor stage.

2. A transistor amplifier for relatively low frequency signals comprising a plurality of transistor stages interconnected between the input and output thereof, and synchronously operated switching means at the input and output respectively adapted to operate at a frequency higher than that of the input signal for transposing the input frequency of said signal to a higher frequency for amplification and retransposing said signal to its original frequency at the output, said switching means at said input being preceded by a series condenser to block out any direct current components present in the input signal.

3. A transistor amplifier comprising a plurality of directly coupled transistor stages, a direct current negative feedback over a plurality of stages and which serves to maintain the operating point of said transistor stages substantially constant with changes in transistor parameters, an alternating current negative feedback into the first stage of said amplifier from a succeeding stage, said alternating current feedback being introduced in series with said input signal for increasing the input impedance to said amplifier, and synchronously operated vibrator switches at the input and output of said amplifier for converting the input signal to a higher frequency for amplification and reconversion to the original frequency at the output, said direct current feedback including a shunt condenser having a capacitance value effective in bypassing the alternating current signal components but which permits the passage of very slowly varying signal components having a frequency which is low as compared with that of said vibrator switches.

4. A transistor amplifier comprising a plurality of transistor stages interconnected between the input and output thereof, said stages consisting of P-N-P and N-P-N type transistors arranged in alternation, the output electrode of the transistor in one stage being directly connected to the input electrode of the transistor in the succeeding stage, resistors connected from the junction of said output and said input electrodes, and also to the supply voltage for said stage, an alternating current negative feedback into the first stage of said amplifier from a succeeding stage, said alternating current feedback being introduced in series with said input signal for increasing the input impedance to said amplifier, synchronously operated vibrator switches at the input and output of said amplifier for converting the input signal to a higher frequency for amplification and reconversion to the original frequency at the output, and a direct current negative feedback circuit over more than one stage, last said feedback circuit including a shunt condenser having a capacitance value effective in bypassing the alternating current signal components but which permits the passage of very slowly varying signal components having a frequency which is low as compared with that of said vibrator switches.

5. A transistor amplifier for relatively low frequency signals comprising a plurality of directly coupled transistor stages interconnected between the input and output thereof, synchronously operated switching means at the input and output respectively adapted to operate at a frequency higher than that of the input signal for transposing the input frequency of said signal to a higher frequency for amplification and retransposing said signal to its original frequency at the output, said switching means at said input being provided with a series condenser to block out any direct current components present in the input signal, and a direct current negative feedback circuit over more than one stage, said feedback circuit including a shunt condenser having a capacitance value effective in bypassing the alternating current signal components but which permits the passage of very slowly varying signal components and which have a frequency which is low as compared with that of said vibrator switches.

References Cited in the file of this patent

UNITED STATES PATENTS

| | | |
|---|---|---|
| 1,378,712 | Milnor | May 17, 1921 |
| 2,297,543 | Eberhardt et al. | Sept. 29, 1942 |

(Other references on following page)

UNITED STATES PATENTS

| | | |
|---|---|---|
| 2,412,227 | Och et al. | Dec. 10, 1946 |
| 2,459,177 | Moseley et al. | Jan. 18, 1949 |
| 2,459,730 | Williams | Jan. 18, 1949 |
| 2,485,948 | Williams et al. | Oct. 25, 1949 |
| 2,517,960 | Barney et al. | Aug. 8, 1950 |
| 2,586,167 | Kamm | Feb. 19, 1952 |
| 2,647,958 | Barney | Aug. 4, 1953 |
| 2,666,818 | Shockley | Jan. 19, 1954 |
| 2,688,729 | Offner | Sept. 7, 1954 |
| 2,750,456 | Waldhauer | June 12, 1956 |
| 2,760,007 | Lozier | Aug. 21, 1956 |
| 2,789,164 | Stanley | Apr. 16, 1957 |
| 2,801,296 | Blecher | July 30, 1957 |

FOREIGN PATENTS

| | | |
|---|---|---|
| 665,867 | Great Britain | Jan. 30, 1952 |

OTHER REFERENCES

Shea text, "Principles of Transistor Circuits," pages 341–344, 176, 349, 350 and 351, pub. 1953 by John Wiley & Sons, N.Y.C.

Lohman article, "Complementary Symmetry Transistor Circuits," "Electronics," September 1953, pages 140–143.